United States Patent
Liu et al.

(10) Patent No.: US 11,646,732 B1
(45) Date of Patent: May 9, 2023

(54) POWER MODULE (71) Applicant: NATIONAL YANG MING CHIAO TUNG UNIVERSITY, Hsinchu (TW)

(72) Inventors: Ching-Yao Liu, Hsinchu (TW); Yueh-Tsung Hsieh, Hsinchu (TW); Kuo-Bin Wang, Hsinchu (TW); Chih-Chiang Wu, Hsinchu County (TW); Li-Chuan Tang, Taoyuan (TW); Wei-Hua Chieng, Hsinchu (TW); Edward Yi Chang, Hsinchu (TW); Stone Cheng, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 17/573,215

(22) Filed: Jan. 11, 2022

(30) Foreign Application Priority Data

Nov. 5, 2021 (TW) .................................. 110141261

(51) Int. Cl.
*H03K 17/081* (2006.01)
*H03K 17/0814* (2006.01)
*H03K 17/12* (2006.01)
*H02M 3/155* (2006.01)
*H03K 17/687* (2006.01)
*H02M 3/158* (2006.01)
*H01L 29/778* (2006.01)
*G05F 1/56* (2006.01)
*H01L 29/20* (2006.01)

(52) U.S. Cl.
CPC ............. *H03K 17/687* (2013.01); *G05F 1/56* (2013.01); *H01L 29/7787* (2013.01); *H02M 3/158* (2013.01); *H01L 29/2003* (2013.01)

(58) Field of Classification Search
None
See application file for complete search history.

(56) References Cited

U.S. PATENT DOCUMENTS

| | | | | |
|---|---|---|---|---|
| 9,142,544 B2* | 9/2015 | Ikeda | ...................... | H01L 28/20 |
| 9,601,483 B2* | 3/2017 | Ikeda | .................. | H01L 27/0629 |
| 9,679,880 B2* | 6/2017 | Ikeda | ..................... | H03K 17/74 |
| 10,658,356 B2* | 5/2020 | Ikeda | .................. | H01L 23/5286 |
| 10,720,914 B1* | 7/2020 | Koyama | .............. | H03K 17/102 |

* cited by examiner

*Primary Examiner* — Kenneth B Wells
(74) *Attorney, Agent, or Firm* — Muncy, Geissler, Olds & Lowe, P.C.

(57) ABSTRACT

A power module includes: a GaN transistor, an NMOS transistor, a first capacitor, a first diode and a second diode. The NMOS transistor is electrically connected to the GaN transistor. A negative electrode of the first capacitor is electrically connected to an anode of the first diode and a gate of the GaN transistor. A cathode of the second diode is electrically connected to a gate of the NMOS transistor. The power module further includes a power module control terminal electrically connected to an anode of the first capacitor and an anode of the second diode.

8 Claims, 6 Drawing Sheets

POWER MODULE

BACKGROUND

1. Field of the Disclosure

The present invention relates to a power module and, more particularly, to a power module equipped with a gallium nitride transistor.

2. Description of Related Art

Power supply devices, such as power converters, typically need to be equipped with power modules to adjust power output so as to reduce losses. It is known that the depletion GaN (gallium nitride) transistor has a small Miller effect and thus can be operated at high frequencies, so as to serve preferably as a switch for the power module. However, usually the gate of the depletion GaN transistor will be turned off only when a negative voltage is applied thereto, and a negative voltage is not easily generated, causing difficulty in control. To solve such a problem, in the prior art, depletion GaN transistor is used in conjunction with a laterally diffused metal oxide semiconductor (hereinafter referred to as LDMOS), so that the depletion GaN transistor can be equipped with the characteristic of an enhancement transistor, that is, is turned on only when a positive voltage is applied to the gate thereof. However, the parasitic capacitance of the LDMOS may encounter excessive change during turn-on and turn-off, which will cause the loss of the power module. Therefore, the prior art still has defects to be overcome.

Therefore, it is desirable to provide an improved power module to mitigate and/or obviate the aforementioned problems.

SUMMARY

The present invention provides a power module, which is provided with the characteristics of a gallium nitride transistor, does not need the input of negative voltage, and is capable of reducing the loss of the power module.

The power module includes: a gallium nitride transistor, an NMOS transistor, a first capacitor, a first diode, a second diode, and a power module control terminal. The NMOS transistor is electrically connected to the gallium nitride transistor. The negative electrode of the first capacitor is electrically connected to the gate of the gallium nitride transistor. The anode of the first diode is electrically connected to the first capacitor and the gate of the gallium nitride transistor. The cathode of the second diode is electrically connected to the gate of the NMOS transistor. The control terminal of the power module is electrically connected to the positive electrode of the first capacitor and the anode of the second diode.

Other objects, advantages, and novel features of the invention will become more apparent from the following detailed description when taken in conjunction with the accompanying drawings.

DETAILED DESCRIPTION

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

Ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. The ordinal numbers are only intended to distinguish a component with a name from another component with the same name.

In addition, the term "adjacent" used herein may refer to describe mutual proximity and does not necessarily mean mutual contact.

In addition, the description of "when . . . " or "while . . . " in the present disclosure means "now, before, or after", etc., and is not limited to occurrence at the same time. In the present disclosure, the similar description of "disposed on" or the like refers to the corresponding positional relationship between the two elements, and does not limit whether there is contact between the two elements, unless specifically limited. Furthermore, when the present disclosure recites multiple effects, if the word "or" is used between the effects, it means that the effects can exist independently, but it does not exclude that multiple effects can exist at the same time.

In addition, the terms "connect" or "couple" in the description and claims not only refer to direct connection with another component, but also refer to indirect connection or electrical connection with another component. In addition, electrical connection includes direct connection, indirect connection, or communication between two components by radio signals.

In addition, in the specification and claims, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

In addition, each component may be implemented as a single circuit or an integrated circuit in a suitable manner, and may include one or more active components, such as transistors or logic gates, or one or more passive components, for example, resistors, capacitors, or inductors, but not limited thereto. The components may be connected to each other in a suitable manner, for example, respectively matching the input signal and the output signal, and using one or more lines to form a series connection or a parallel connection. In addition, each component may allow input and output signals to enter and exit sequentially or in parallel. The aforementioned configurations are determined according to the actual application.

In addition, in the preset invention, terms such as "system", "apparatus", "device", "module", or "unit" may refer to an electronic component or a digital circuit composed of multiple electronic components, an analog circuit, or other circuits in a broader sense, and unless otherwise specified, they do not necessarily have a hierarchical relationship.

In addition, the technical features of different embodiments disclosed in the present invention may be combined to form another embodiment.

Figure 1:
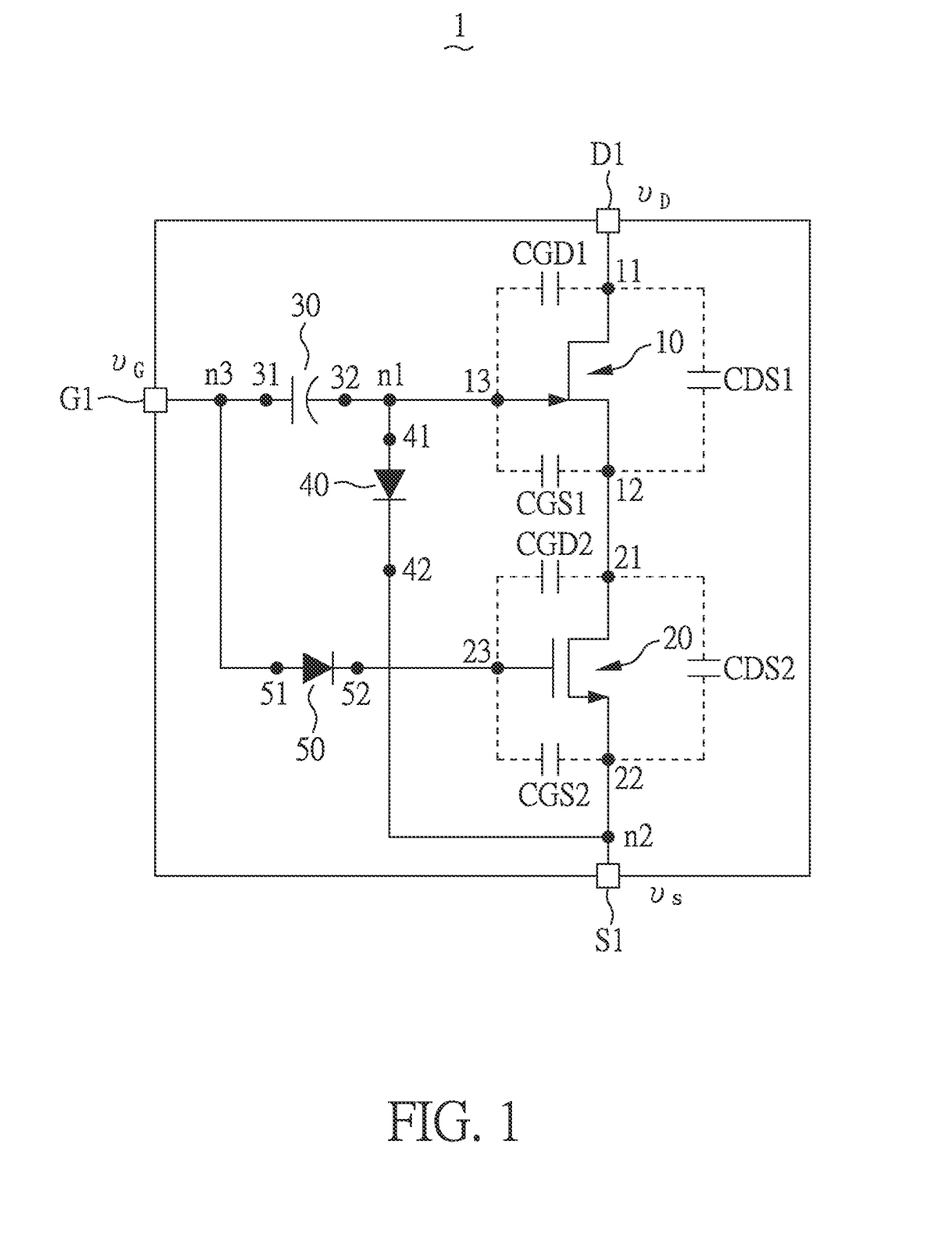
FIG. 1 is a circuit diagram of the power module according to the first embodiment of the present invention.

FIG. 1 is a circuit diagram of the power module 1 according to a first embodiment of the present invention. As shown in FIG. 1, the power module 1 includes a GaN (gallium nitride) transistor 10, a metal-oxide semiconductor field-effect transistor (hereinafter referred to as NMOS transistor) 20, a first capacitor 30, a first diode 40, a second diode 50, a first power module connection terminal D1, a second power module connection terminal S1, and a power module control terminal G1. The GaN transistor 10 has a drain 11, a source 12 and a gate 13. The NMOS transistor 20 has a drain 21, a source 22 and a gate 23. The first capacitor 30 has a positive electrode 31 and a negative electrode 32. The first diode 40 has an anode 41 and a cathode 42. The second diode 50 has an anode 51 and a cathode 52.

In one embodiment, the drain 11 of the GaN transistor 10 may be electrically connected to the first power module connection terminal D1, and the source 12 of the GaN transistor 10 may be connected to the drain 21 of the NMOS transistor 20. The gate electrode 13 of the GaN transistor 10 may be electrically connected to the negative electrode 32 of the first capacitor 30 and the anode 41 of the first diode 40. For example, the gate 13 of the GaN transistor 10, the negative electrode 32 of the first capacitor 13 and the anode 41 of the first diode 40 may be electrically connected to a node n1. The source 22 of the NMOS transistor 20 may be electrically connected to the second power module connection terminal S1 and the cathode 42 of the first diode 40. For example, the source 22 of the NMOS transistor 20, the second power module connection terminal S1, and the cathode 42 of the first diode 40 may be electrically connected to a node n2, and the gate 23 of the NMOS transistor 20 may be electrically connected to the cathode 52 of the second diode 50. The positive electrode 31 of the first capacitor 30 may be electrically connected to the power module control terminal G1. The anode 51 of the second diode 50 may be electrically connected to the power module control terminal G1 and the positive electrode 31 of the first capacitor 30. For example, the anode 51 of the second diode 50, the power module control terminal G1 and the positive electrode 31 of the first capacitor 30 may be electrically connected to a node n3. However, the present invention is not limited thereto.

In one embodiment, the power module control terminal G1 may receive a control signal VG from the outside of the power module 1, but is not limited thereto. The control signal VG may be transmitted to the gate 13 of the GaN transistor 10 through the first capacitor 30 to influence whether to turn on the GaN transistor 10 or not. In addition, the control signal VG may also be transmitted to the gate 23 of the NMOS transistor 20 through the second diode 50 to influence whether to turn on the NMOS transistor 20 or not. In addition, in one embodiment, the first power module connection terminal D1 may be connected to a first signal VD, such as a high voltage level signal, but is not limited thereto. In addition, in one embodiment, the second power module connection terminal S1 may be connected to a second signal VS, such as a low voltage level signal, a zero voltage signal, or ground. However, the present invention is not limited thereto.

In one embodiment, the GaN transistor 10 is, for example, a depletion GaN transistor. In one embodiment, the GaN transistor 10 and the NMOS transistor 20 may be in a cascode structure and, through cascoding the GaN transistor 10 and the NMOS transistor 20, the power module 1 may be formed as a normally closed power module, but it is not limited thereto.

In one embodiment, the first capacitor 30 and the first diode 40 may form a clamping circuit, but it is not limited thereto.

In one embodiment, during the operation of the power module 1, there may be a parasitic capacitance existed between the gate 13 and the source 12 of the GaN transistor 10 (hereinafter referred to as the first gate-source parasitic capacitance CGS1), a parasitic capacitance existed between the gate 13 and the drain 11 of the GaN transistor 10 (hereinafter referred to as the first gate-drain parasitic capacitance CGD1), and a parasitic capacitance existed between the drain 11 and the source 12 of the GaN transistor 10 (hereinafter referred to as the first drain-source parasitic capacitance CDS1). In addition, there may be a parasitic capacitance existed between the gate 23 and the source 22 of the NMOS transistor 20 (hereinafter referred to as the second gate-source parasitic capacitance CGS2), a parasitic capacitance existed between the gate 23 and the drain 21 of the NMOS transistor 20 (hereinafter referred to as the second gate-drain parasitic capacitance CGD2), and a parasitic capacitance existed between the drain 21 and the source 22 of the NMOS transistor 20 (hereinafter referred to as the second drain-source parasitic capacitance CDS2). However, the present invention is not limited thereto.

In one embodiment, the capacitance value of the first capacitor 30 is greater than or equal to ten times the capacitance value of the gate-source parasitic capacitance (CGS1), whereby a large amount of charge may be stored in the first capacitor 30, but it is not limited thereto.

Figure 2:
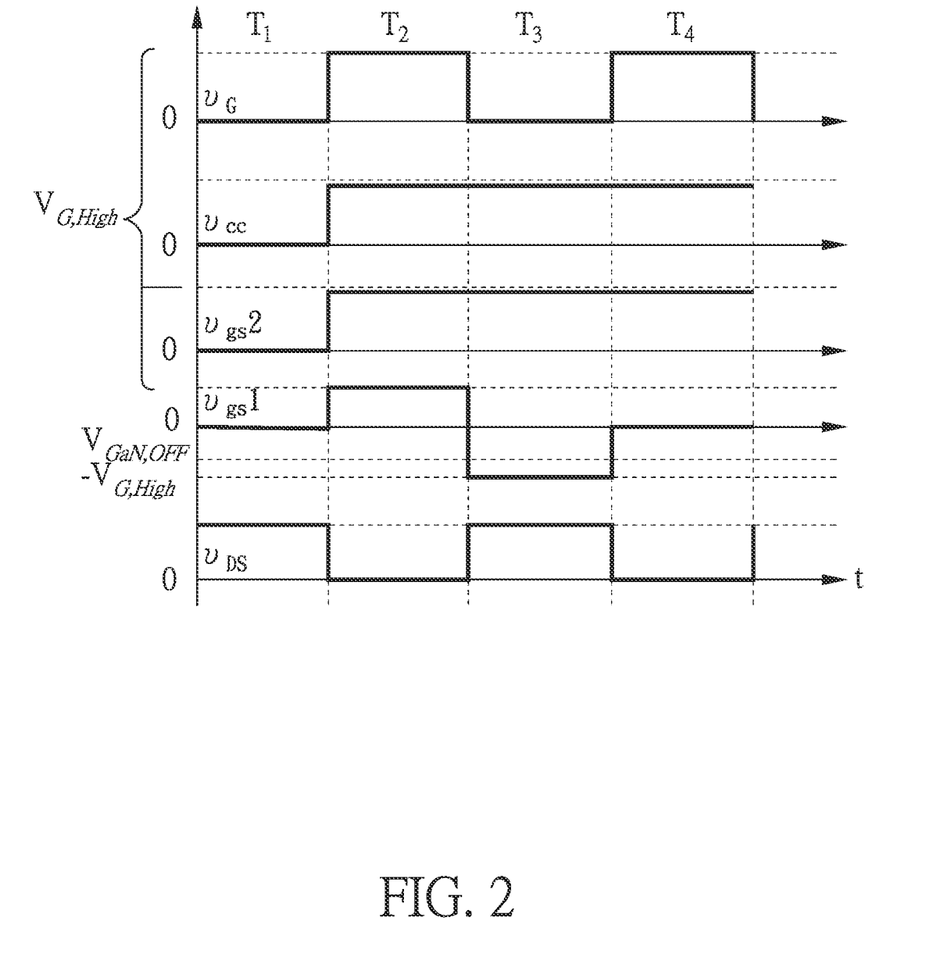
FIG. 2 is a driving timing diagram of the power module according to the first embodiment of the present invention.

Next, the operation process of the power module 1 (that is, the operation of the GaN transistor 10 and the NMOS transistor 20 under different operating timings) will be described. FIG. 2 is a driving timing diagram of the power module 1 according to the first embodiment of the present invention, and please refer to FIG. 2 and FIG. 1 at the same time.

As shown in FIG. 2, the operating timing of the power module 1 may include a first operating period T1, a second operating period T2, a third operating period T3, and a fourth operating period T4, but is not limited thereto.

During the first operating period T1, the voltage of the control signal VG presents a low voltage level, such as a zero voltage level, or the power module control terminal G1 presents an off state, while the following description is given by taking the zero voltage level as an example. At this moment, a gate-source voltage Vgs1 of the GaN transistor 10 and a gate-source voltage Vgs2 of the NMOS transistor 20 also present a zero voltage level. Since the GaN transistor 10 may be a depletion GaN transistor, its threshold voltage typically corresponds to a negative voltage level. Therefore, when its gate-source voltage Vgs1 presents a zero voltage level, the GaN transistor 10 will be turned on. That is, the GaN transistor 10 is in the turn-on state during the first operating period T1. In addition, the gate voltage of the NMOS transistor 20 usually corresponds to a positive voltage level. Therefore, when its gate-source voltage Vgs2 is at a zero voltage level, the NMOS transistor 20 will not be turned on, that is, the NMOS transistor 20 is in the turn-off state during the first operating period T1. Since the NMOS transistor 20 is turned off, the connection path between the first power module connection terminal D1 and the second power module connection terminal S1 is in a non-conducting state, so that the power module 1 is also in an off state during the first operating period T1 and, at this moment, a power module drain-source voltage VDS between the first power module connection terminal D1 and the second power module connection terminal S1 will present a high voltage level.

During the second operating period T2, the voltage of the control signal VG is transited from a low voltage level to a high voltage level (for example, VG,High). At this moment, the first capacitor 30 is being charged, and the gate-source voltage Vgs1 of the GaN transistor 10 and the gate-source voltage Vgs2 of the NMOS transistor 20 both present a positive voltage level. Therefore, during the second operating period T2, the GaN transistor 10 and the NMOS transistor 20 are both in the on state, so that the power module 1 is in the on state during the second operating period T2. At this moment, the power module drain-source voltage VDS between the first power module connection terminal D1 and the second power module connection terminal S1 will present a low voltage level, such as a zero voltage level.

During the third operating period T3, the voltage of the control signal VG changes from a high voltage level (for example, VG,High) to a low voltage level (for example, a zero voltage level). At this moment, because the anode 41 of the first diode 40 is connected with the negative electrode 32 of the first capacitor 30 and the gate 13 of the GaN transistor 10, and the cathode 42 of the first diode 40 is connected with the second power module connection terminal S1, the electrons accumulated on the negative electrode 31 of the first capacitor 30 during the second operating period T2 cannot be discharged from the first diode 40, so that the gate-source voltage Vgs1 of the GaN transistor 10 will present a negative voltage level (for example −VG,High), and the positive charges accumulated on the gate 23 of the NMOS transistor 20 cannot be discharged through the second diode 50, so that the gate-source voltage Vgs2 of the NMOS transistor 20 still presents a positive voltage level. In one embodiment, the gate-source voltage Vgs1 (for example −VG,High) at this moment may be lower than the threshold voltage (for example, VGaN,OFF) of the GaN transistor 10, and thus the GaN transistor 10 will present a turn-off state, that is, the GaN transistor 10 is in the off state during the third operating period T3, and the NMOS transistor 20 is in the on state during the third operating period T3, so that the power module 1 is in an off state during the third operating period T3 and, at this moment, the power module drain-source voltage VDS between the first power module connection terminal D1 and the second power module connection terminal S1 will present a high voltage level.

In addition, during the third operating period T3, since the cathode 52 of the second diode 50 is connected with the gate 23 of the NMOS transistor 20, most of the electrons are blocked by the second diode 50 and thus remain in the second gate-source parasitic capacitance CGS2 between the gate 23 and the source 22 of the NMOS transistor 20, so that the second gate-source parasitic capacitance CGS2 is kept continuously in a charging state, and the gate-source voltage Vgs2 of the NMOS transistor 20 continuously presents a positive voltage, that is, the NMOS transistor 20 will continue to be in the on state from the third operating period T3.

During the fourth operating period T4, the voltage of the control signal VG changes from a low voltage level (such as zero voltage level) to a high voltage level (such as VG,High) again. The NMOS transistor 20 is turned on continuously and, at this moment, as long as a zero voltage level or positive voltage level is applied to the gate 13 of the GaN transistor 10, the GaN transistor 10 may present an on state. When the GaN transistor 10 is turned on, the power module drain-source voltage VDS between the first power module connection terminal D1 and the second power module connection terminal S1 will present a low voltage level. Thus, it can be seen that, starting from the third operating period T3, the power module 1 may be driven completely through the turn-on state of the GaN transistor 10, that is, the control signal VG can be used to control the turn-on state of the GaN transistor 10 so as to drive the power module 1.

As a result, when the control signal VG is transited to a high voltage level for the first time, the NMOS transistor 20 is continuously turned on, and the power module 1 may be switched through the GaN transistor 10, so as to be provided with more characteristics of GaN transistor in comparison with the prior art, such as high-frequency switching or high breakdown voltage. Alternatively, since the NMOS transistor 20 can be continuously turned on, it is able to reduce the probability that the gate-source voltage of the GaN transistor 10 is excessively negative, which can prevent the power module 1 from being damaged.

The power module 1 of the present invention may also have different implementation aspects.

Figure 3:
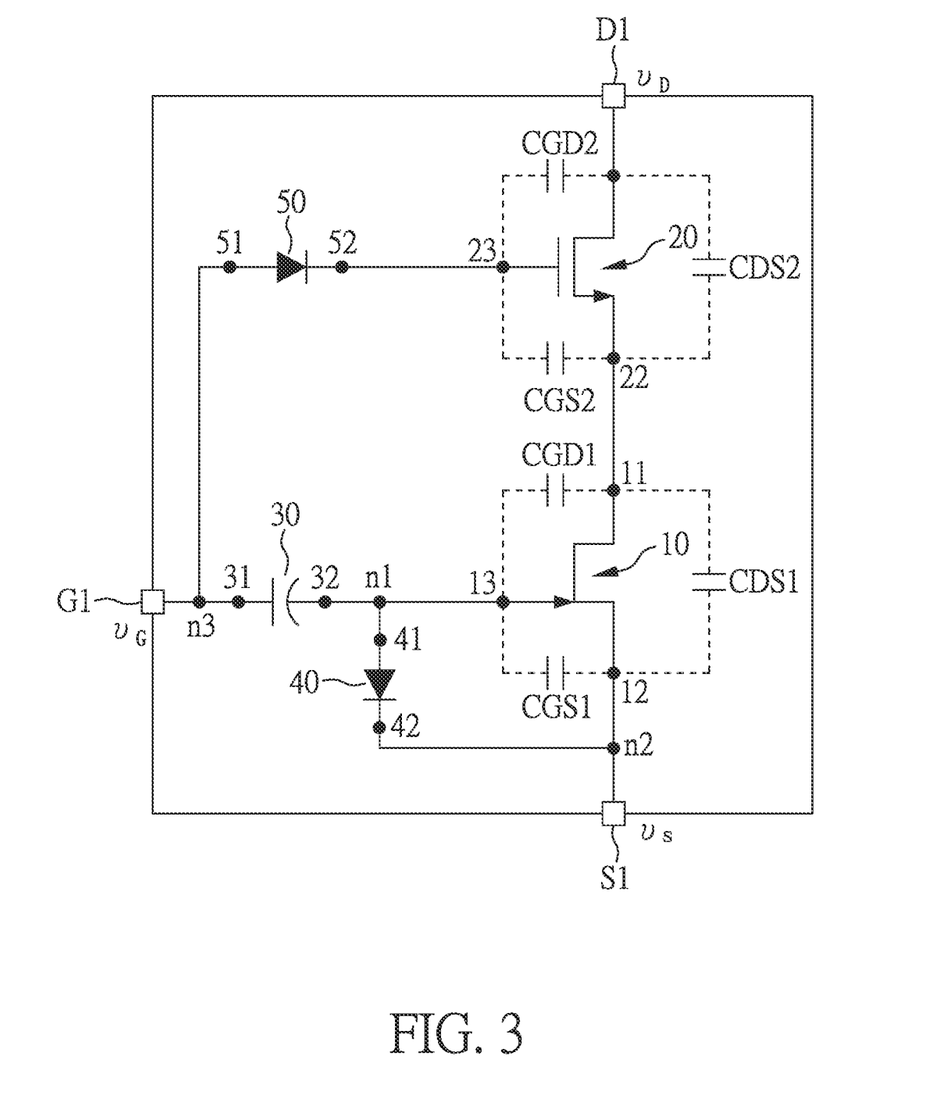
FIG. 3 is a circuit diagram of the power module according to the second embodiment of the present invention.

FIG. 3 is a circuit diagram of the power module 1 according to the second embodiment of the present invention. Please refer to FIGS. 1 and 2, as a reference, and FIG. 3. As shown in FIG. 3, the power module 1 also includes a GaN transistor 10, an NMOS transistor 20, a first capacitor 30, a first diode 40, a second diode 50, a power module control terminal G1, a first power module connection terminal D1 and a second power module connection terminal 51. The details of the aforementioned components may be realized from the description of the first embodiment (with reference to FIG. 1), and thus a detained description is deemed unnecessary. The following description mainly focuses on the differences.

In the second embodiment, the drain 21 of the NMOS transistor 20 may be electrically connected to the first power module connection terminal D1, and the source 22 of the NMOS transistor 20 may be electrically connected to the drain 11 of the GaN transistor 10. The gate 23 of the NMOS transistor 20 may be electrically connected to the cathode 52 of the second diode 50. The source 12 of the GaN transistor 10 may be electrically connected to the second power module connection terminal S1 and the cathode 42 of the first diode 40, for example, the source 12 of the GaN transistor 10, the second power module connection terminal S1 and the cathode 42 of the first diode 40 may be electrically connected to the node n2. The gate 13 of the GaN transistor 10 may be electrically connected to the anode 51 of the first diode 400 and the negative electrode 32 of the first capacitor 30, for example, the gate 13 of the GaN transistor 10, the negative electrode 32 of the first capacitor 30, and the anode 41 of the first diode 40 may be electrically connected to the node n1. The positive electrode 31 of the first capacitor 30 may be electrically connected to the power module control terminal G1 and the anode 51 of the second diode 50, for example, the positive electrode 31 of the first capacitor 30, the anode 51 of the second diode 50, and the power module control terminal G1 may be electrically connected to the node n3. However, the present invention is not limited thereto. In view of this, it can be seen that the second embodiment is different from the first embodiment mainly in the connection mode of the GaN transistor 10 and the NMOS transistor 20.

Figure 4:
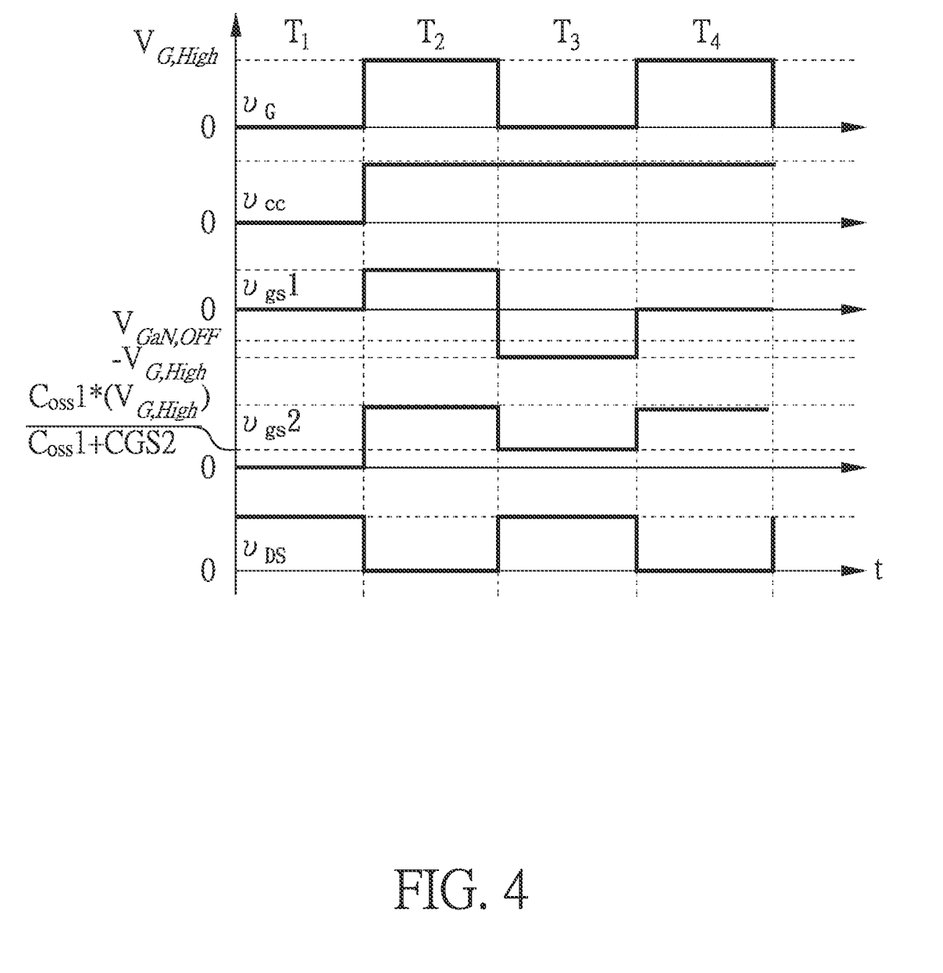
FIG. 4 is a driving timing diagram of the power module according to the second embodiment of the present invention.

Next, the operating process of the power module 1 of the second embodiment will be described. FIG. 4 is a driving timing diagram of the power module 1 according to the second embodiment of the present invention, and please refer to FIG. 4 and FIG. 3 at the same time. It is noted that, in order to make the drawings clear, the presentation positions of Vgs1 and Vgs2 in FIG. 4 are opposite to those in FIG. 2.

During the first operating period T1, the voltage of the control signal VG presents a low voltage level (a zero voltage level is taken as an example as below). At this moment, the gate-source voltage Vgs1 of the GaN transistor 10 and the gate-source voltage Vgs2 of the NMOS transistor 20 will also present a zero voltage level, so that the GaN transistor 10 will be turned on, but the NMOS transistor 20 will not be turned on. Therefore, the power module 1 is also in an off state during the first operating period T1.

During the second operating period T2, the voltage of the control signal VG is transited from a low voltage level to a high voltage level (for example, VG,High). At this moment, the gate-source voltage Vgs1 of the GaN transistor 10 and the gate-source voltage Vgs2 of the NMOS transistor 20 both present a positive voltage level, so that the GaN transistor 10 and the NMOS transistor 20 are both in a turn-on state. Therefore, the power module 1 is turned on during the second operating period T2.

During the third operating period T3, the control signal VG is transited from a high voltage level to a low voltage level (for example, a zero voltage level). As in the first embodiment, most of the electrons will flow from the first diode 40 to the negative electrode 32 of the first capacitor 30 at this moment, and the gate-source voltage Vgs1 of the GaN transistor 10 will present a negative voltage level (for example, −VG,High), which is lower than the threshold voltage of the GaN transistor 10 (for example, VGaN,OFF), so that the GaN transistor 10 will be in a turn-off state.

In addition, since the cathode 52 of the second diode 50 is connected with the gate 23 of the NMOS transistor 20, most of the electrons are blocked by the second diode 50 and thus remain in the second gate-source parasitic capacitance CGS2 between the gate 23 and the source 22 of the NMOS transistor 20, so that the second gate-source parasitic capacitance CGS2 is kept continuously in a charging state. However, since the source 22 of the NMOS transistor 20 is connected to the drain of the GaN transistor 10, the gate-source voltage Vgs2 of the NMOS transistor 20 will be affected by the GaN transistor 10 to present a state different from the first embodiment, which will be described in the following.

Figure 5:
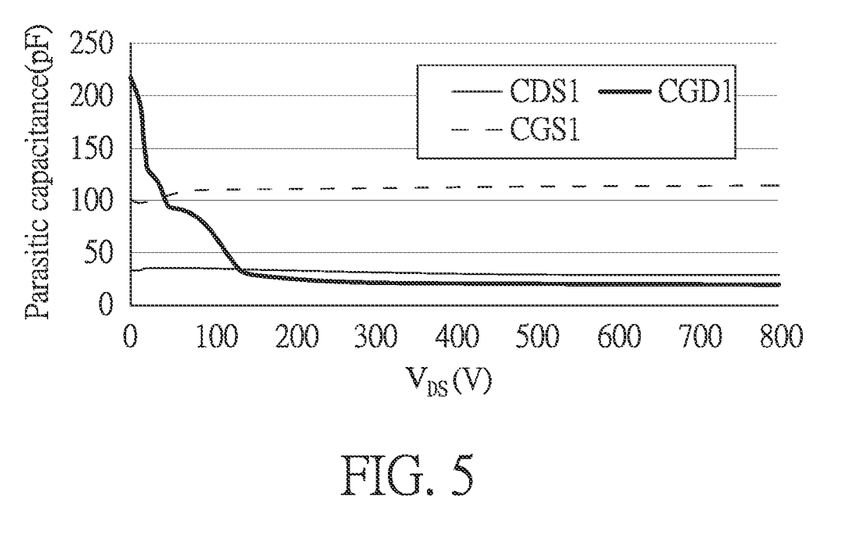
FIG. 5 is a schematic diagram illustrating the capacitance value change of the parasitic capacitance of the gallium nitride transistor according to an embodiment of the present invention.

FIG. 5 is a schematic diagram illustrating the capacitance value changes of the parasitic capacitances CDS1, CGS1, CGD1 of the GaN transistor 10 according to an embodiment of the present invention, in which the capacitance value changes of the parasitic capacitances CDS1, CGS1, CGD1 of the GaN transistor 10 corresponding to different states of the power module 1 are shown. As shown in FIG. 5, when the power module 1 changes from a turn-on state (for example, VDS=0) to a turn-off state (for example, VDS>0), the first drain-source parasitic capacitance CDS1 and the first gate-source parasitic capacitance CGS1 of the GaN transistor 10 are substantially kept to have the same capacitance value, but the first gate-drain parasitic capacitance CGD1 of the GaN transistor 10 will drastically decrease as the power module 1 is turned off. Thus, it can be seen that, during the third operating period T3, the first gate-drain parasitic capacitance CGD1 will change drastically, which will affect the gate-source voltage Vgs2 of the NMOS transistor 20.

With reference to FIG. 4 again, in one embodiment, during the third operating period T3, the gate-source voltage Vgs2 of the NMOS transistor 20 may be expressed by the following equation:

$$Vgs2 = Coss1*(VG,High)/(Coss1+CGS2), \quad \text{(equation 1)}$$

where Coss1 is the parasitic output capacitance of the GaN transistor 10, Coss1 may also be expressed as CDS1+CGD1, and CDS1, CGD1 and CGS2 represent capacitance values.

In one embodiment, in order to maintain the turn-on state of the NMOS transistor 20, the gate-source voltage Vgs2 of the NMOS transistor 20 has to be greater than or equal to the threshold voltage of the NMOS transistor 20, that is, Coss1*(VG,High)/(Coss1+CGS2)≥the threshold voltage of NMOS transistor 20. In one embodiment, "Coss1*(VG,High)/(Coss1+CGS2)≥the threshold voltage of NMOS transistor 20" may be achieved at least by selecting NMOS transistor 20 and GaN transistor 10 with appropriate specifications. For example, when the parasitic capacitance values of the NMOS transistor 20 and the GaN transistor 10 are known, the selection is made for matching based on the parasitic capacitance values of the NMOS transistor 20 and the GaN transistor 10, so that the gate-source voltage Vgs2 of the NMOS transistor 20 may be greater than the threshold voltage of the NMOS transistor 20 during the third operating period T3. As a result, the NMOS transistor 20 of the second embodiment may be kept continuously in the turn-on state. However, the present invention is not limited thereto.

In the fourth operating period T4, the NMOS transistor 20 is turned on continuously and, at this moment, as long as a zero voltage level or a positive voltage level is applied to he gate 13 of the GaN transistor 10, the GaN transistor 10 may present a turn-on state. Therefore, whether the the power module 1 is turned on or not can be controlled by controlling the GaN transistor 10.

Accordingly, the power module 1 of the second embodiment may achieve the same effect as the first embodiment.

In addition, the power module 1 of the present invention may be applied to various products that require power management, such as power converters, wireless chargers, etc., and is not limited thereto. Hereinafter, an embodiment is given to illustrate the application of the power module 1 of the present invention to a power converter.

Figure 6:
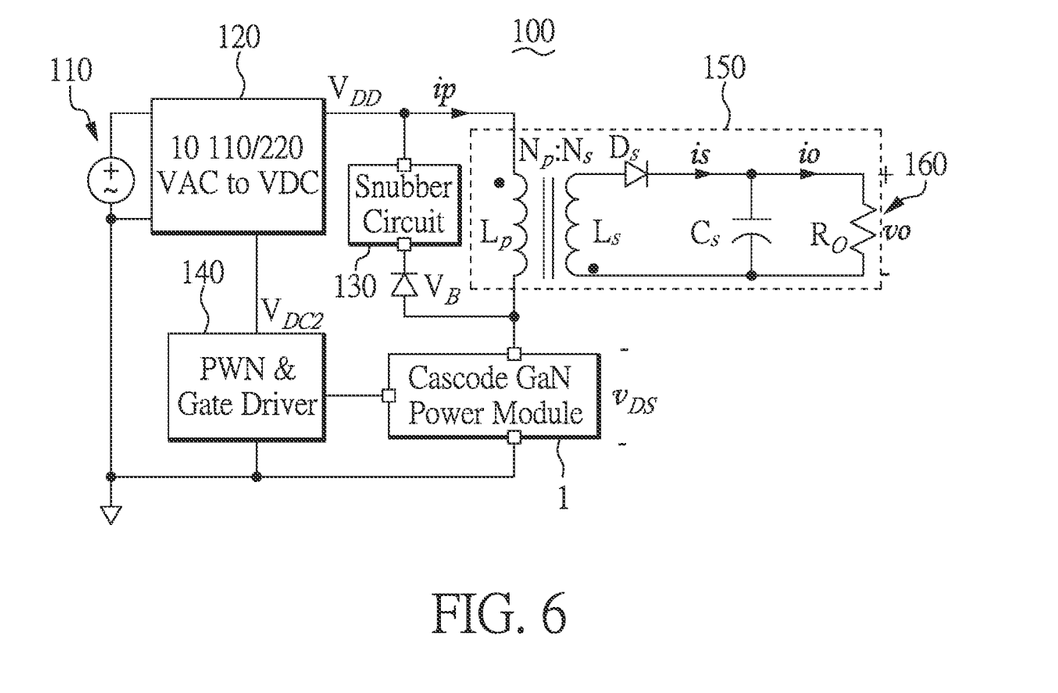
FIG. 6 is a schematic diagram illustrating the structure of the power converter using the power module of the present invention.

FIG. 6 is a schematic diagram illustrating the structure of the power converter 100 using the power module 1 of the present invention, and please refer to FIG. 6 and FIGS. 1 to 5 at the same time.

As shown in FIG. 6, the power converter 100 may include an input terminal 110, an AC-to-DC converter circuit 120, a snubber circuit 130, a pulse width modulation and gate driver 140, a power module 1, a transformer circuit 150 and an output terminal 160.

The input terminal 110 may be electrically connected to the AC-to-DC converter circuit 120. The AC-to-DC converter circuit 120 may be electrically connected to the snubber circuit 130. The AC-to-DC converter circuit 120 may also be electrically connected to the pulse width modulation and gate driver 140. The snubber circuit 130 may be electrically connected to the transformer circuit 150. The pulse width modulation and gate driver 140 may be electrically connected to the power module control terminal G1 of the power module 1. The first power module connection terminal D1 of the power module 1 may be connected to the snubber circuit 130 through a diode DB. The second power module connection terminal S1 of the power module 1 may be grounded. The transformer circuit 150 may be connected to the output terminal 160.

In one embodiment, the input terminal 110 may provide an AC voltage to the AC-to-DC converter circuit 120, and the AC-to-DC converter circuit 120 may convert the AC voltage into a DC voltage, and transmit the DC voltage to the transformer circuit 150 and the pulse width modulation and gate driver 140. The pulse width modulation and gate driver 140 may control whether the power module 1 is turned on or not. The snubber circuit 130 may suppress the voltage surge generated by the GaN transistor 10 of the power module 1 (for example, the surge generated by the voltage between the drain 11 and the source 12). The transformer circuit 150 may transform the magnitude of the DC voltage. The output terminal 160 may output the transformed DC voltage.

Figure 7:
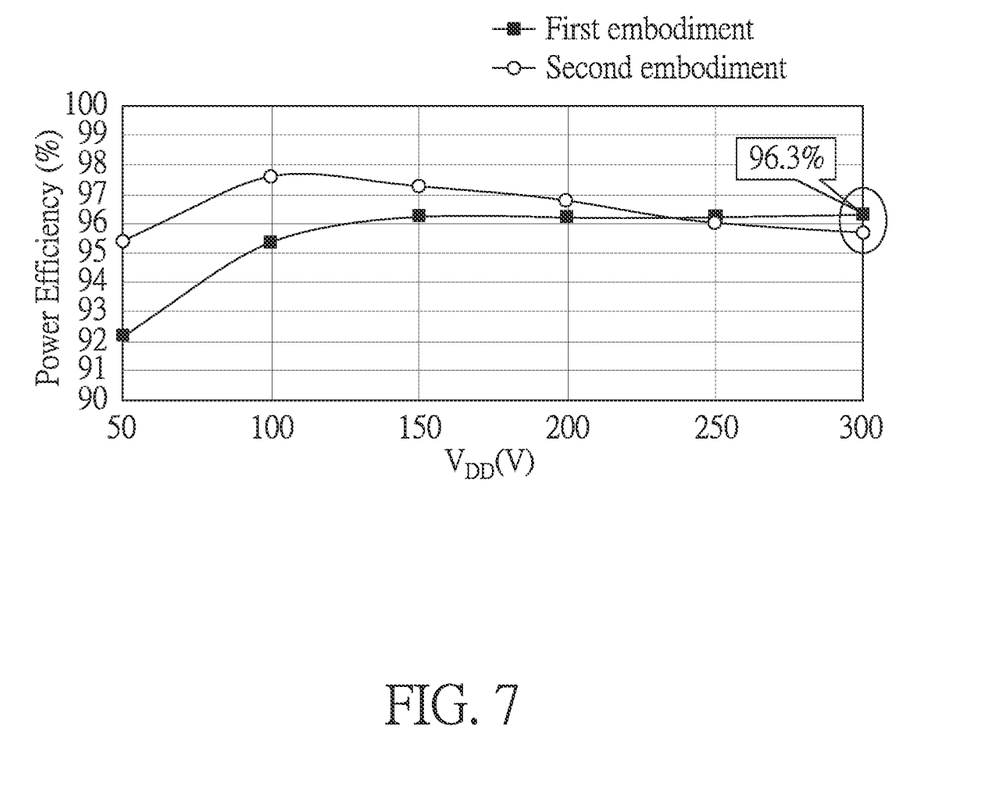
FIG. 7 is a schematic diagram illustrating the experimental efficiency of the power converter using the power module of the present invention.

FIG. 7 is a schematic diagram illustrating the experimental efficiency of the power converter 100 using the power module 1 of the present invention, wherein the power converter 100 adopts the structure of FIG. 6 and, in addition, the output power of this example is set to 60 watts.

As shown in FIG. 7, regardless of whether the power module 1 adopts the structure of the first embodiment or the second embodiment, the conversion efficiency may reach more than 90%. For example, when the input voltage is 300V, the conversion efficiency of the power module 1 may reach 96.3%, which can present an excellent conversion effect.

It is noted that this experimental schematic diagram is only an example, not a limitation of the present invention, and the experimental values may vary due to different experimental environments.

As a result, the present invention provides an improved power module 1, which can solve the problems of the prior art.

In addition, the features between the embodiments of the present invention may be mixed and matched arbitrarily as long as they do not violate the spirit of the invention or conflict with each other.

The aforementioned embodiments are examples only for convenience of description. The scope of the present disclosure is claimed hereinafter in the claims and is not limited to the embodiments.

What is claimed is:

1. A power module, comprising:
a gallium nitride transistor;
an NMOS transistor electrically connected to the gallium nitride transistor;
a first capacitor;
a first diode, wherein a negative electrode of the first capacitor is electrically connected with an anode of the first diode and the gate of the gallium nitride transistor; and
a second diode having a cathode electrically connected to a gate of the NMOS transistor,
wherein the power module further includes a power module control terminal electrically connected with a positive electrode of the first capacitor and an anode of the second diode;
wherein the power module further includes a first power module connection terminal and a second power module connection terminal, wherein the first power module connection terminal is directly connected with a drain of the NMOS transistor, a source of the NMOS transistor is directly connected with a drain of the gallium nitride transistor, and a source of the gallium nitride transistor is directly connected to the second power module connection terminal.

2. The power module of claim 1, wherein a cathode of the first diode is electrically connected to the second power module connection terminal.

3. The power module of claim 2, wherein the power module control terminal is provided to receive a control signal, such that when the control signal is at a low voltage level, the NMOS transistor is not turned on and the gallium nitride transistor is turned on; when the control signal is first transited from the low voltage level to a high voltage level, the NMOS transistor and the gallium nitride transistor are turned on; when the control signal is transited from the high voltage level to the low voltage level again, the NMOS transistor is turned on continuously and the gallium nitride transistor is not turned on; and when the control signal is transited from the low voltage level to the high voltage level again, the NMOS transistor is turned on continuously and the gallium nitride transistor is turned on.

4. The power module of claim 3, wherein there is a gate-source parasitic capacitance between the gate and the source of the gallium nitride transistor, and the first capacitor has a capacitance value greater than or equal to ten times a capacitance value of the gate-source parasitic capacitance.

5. An operating method of a power module, wherein the power module comprises a gallium nitride transistor, an NMOS transistor electrically connected to the gallium nitride transistor, a first capacitor, a first diode, a second diode, and a power module control terminal, wherein a negative electrode of the first capacitor is electrically connected with an anode of the first diode and the gate of the gallium nitride transistor, and a cathode of the second diode is electrically connected to a gate of the NMOS transistor, and the power module control terminal electrically connected with a positive electrode of the first capacitor and an anode of the second diode, the method comprising the steps of:
during a first operating period, providing a control signal with a low voltage level to the power module control terminal, so as to turn on the gallium nitride transistor and to maintain the NMOS transistor turned off, during a second operating period, transiting the control signal from the low voltage level to a high voltage level, so as to turn on the NMOS transistor and the gallium nitride transistor, wherein the NMOS transistor is kept in a turn-on state subsequently without being affected by the control signal, during a third operating period, transiting the control signal from the high voltage level to the low voltage level again, so as to turn off the gallium nitride transistor, wherein the NMOS transistor is turned on continuously; and during a fourth operating period, transiting the control signal from the low voltage level to the high voltage level again, so as to turn on the gallium nitride transistor, wherein the NMOS transistor is turned on continuously.

6. The operating method of claim 5, wherein the power module further comprises a first power module connection terminal and a second power module connection terminal, wherein the first power module connection terminal is electrically connected with a drain of the gallium nitride transistor, a source of the gallium nitride transistor is electrically connected with a drain of the NMOS transistor, and a source of the NMOS transistor is electrically connected with the second power module connection terminal.

7. The operating method of claim 6, wherein a cathode of the first diode is electrically connected to the second power module connection terminal.

8. The operating method of claim 7, wherein there is a gate-source parasitic capacitance between the gate and the source of the gallium nitride transistor, and the first capacitor has a capacitance value greater than or equal to ten times a capacitance value of the gate-source parasitic capacitance.

* * * * *